US007958430B1

(12) United States Patent
Kolokowsky et al.

(10) Patent No.: US 7,958,430 B1
(45) Date of Patent: Jun. 7, 2011

(54) FLASH MEMORY DEVICE AND METHOD

(75) Inventors: Steve H. Kolokowsky, San Diego, CA (US); Mark D. McCoy, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 882 days.

(21) Appl. No.: 11/425,004

(22) Filed: Jun. 19, 2006

Related U.S. Application Data

(60) Provisional application No. 60/692,219, filed on Jun. 20, 2005.

(51) Int. Cl.
*G11C 29/00* (2006.01)

(52) U.S. Cl. ........................................................ 714/763

(58) Field of Classification Search .................... 714/763
See application file for complete search history.

(56) References Cited

U.S. PATENT DOCUMENTS

| | | | | |
|---|---|---|---|---|
| 5,436,914 A | * | 7/1995 | Augustine et al. ............ | 718/104 |
| 5,822,618 A | * | 10/1998 | Ecclesine ......................... | 710/57 |
| 5,882,618 A | * | 3/1999 | Bhatia et al. .................. | 423/376 |
| 5,996,041 A | | 11/1999 | Kim | |
| 6,055,578 A | * | 4/2000 | Williams et al. .............. | 709/253 |
| 6,185,134 B1 | * | 2/2001 | Tanaka ..................... | 365/185.33 |
| 6,381,176 B1 | * | 4/2002 | Kim et al. ................ | 365/185.11 |
| 6,643,188 B2 | * | 11/2003 | Tanaka et al. ............ | 365/189.16 |
| 6,813,184 B2 | | 11/2004 | Lee | |
| 7,328,365 B2 | * | 2/2008 | Karpuszka et al. ............... | 714/6 |
| 2005/0246613 A1 | * | 11/2005 | Blaauw et al. ................ | 714/763 |
| 2005/0283566 A1 | * | 12/2005 | Callaghan ..................... | 711/104 |
| 2007/0300038 A1 | * | 12/2007 | Ware .............................. | 711/203 |
| 2008/0313368 A1 | * | 12/2008 | Kuo et al. ....................... | 710/57 |

\* cited by examiner

*Primary Examiner* — Scott T Baderman
*Assistant Examiner* — Enam Ahmed

(57) ABSTRACT

An improved flash memory device and method for improving the performance and reliability of a flash memory device is provided. According to one embodiment, a method for writing data to a memory device may include writing the data to a temporary storage location within the memory device before the data is copied to another location within the memory device, incrementing a count value to indicate that the data has been copied, and repeating the step of writing, if the count value is less than a threshold value. If the count value is greater than or equal to the threshold value, the method may write the data to an external memory controller, where the data is checked for errors and corrected if an error is found, before the data is copied to the other location within the memory device.

18 Claims, 6 Drawing Sheets

FLASH MEMORY DEVICE AND METHOD

PRIORITY CLAIM

This application claims priority to U.S. Provisional Application No. 60/692,219 filed Jun. 20, 2005.

BACKGROUND OF THE INVENTION

1. Field of the Invention

This invention relates to semiconductor memory and, more particularly, to systems and methods for improving the performance of a flash memory device, while maintaining high reliability.

2. Description of the Related Art

The following descriptions and examples are not admitted to be prior art by virtue of their inclusion within this section.

Numerous types of semiconductor memory are currently available in the marketplace today. Though an array of storage elements is commonly included within each type of memory, the storage elements of different memory types often differ in both architecture and function. For example, a memory storage element can be volatile or non-volatile. Types of volatile memory include memory that must be periodically refreshed (e.g., DRAM) or memory that will lose its programmed state if power is removed from the memory circuit (e.g., SRAM). Unlike volatile memory, however, non-volatile memory is able to maintain its stored contents when power is removed from the memory circuit. Types of non-volatile memory include read-only memory (such as ROM, PROM, EPROM and EEPROM), magnetic random access memory (MRAM), battery-backed SRAM (BBSRAM) and flash memory.

There are two primary types of flash memory technologies—NOR flash and NAND flash. NOR flash is commonly used in embedded core applications, whereas NAND flash is commonly used to replace bulk storage. Like most semiconductor memory, each flash memory device may generally include an array of storage elements or memory cells. However, the storage elements included within NOR and NAND flash devices differ in both architecture and function, and therefore, provide different advantages/disadvantages.

For example, NOR technology features high-speed, random access to bit storage, low error rates and high endurance (e.g., it may support up to one million program/erase cycles without requiring error correction). However, because the memory cells of a NOR flash device are each coupled in parallel between a common bit line and individual source lines, NOR technology offers less density (and therefore, higher cost) than NAND flash devices. NOR flash devices also tend to consume more power and require a longer programming time than NAND flash devices. On the other hand, NAND technology ties a string of single-bit storage transistors (constituting, e.g., 16 or 32 memory cells) in series between a common bit line and a common source line. This reduces the number of memory cell contacts and allows greater density. However, because the memory cells must be accessed sequentially, read and write errors tend to be more prevalent in NAND flash devices. As a result, NAND devices require error correction.

A commonality between all flash devices is that a memory cell must be erased before data can be programmed (or written to) a memory cell. Though each device can be erased on a block-basis, the reading and programming times for a NAND flash device are significantly shorter than those of a NOR flash device (sometimes by an order of magnitude). For example, the programming current is very small in NAND flash devices, which use Fowler-Nordheim tunneling for both erasing and programming. Because the programming current is very small, the power consumption for programming does not significantly increase when the number of memory cells being programmed is increased. This allows a plurality of NAND flash memory cells to be programmed at the same time, so that the programming time per byte becomes very short. In most cases, the read and program operations of a NAND flash device take place on a page-basis (e.g., 528 bytes at a time for most NAND devices). Since NOR flash devices use the hot electron injection mechanism for programming, they tend to consume more power and require significantly longer programming times per byte than NAND flash devices. For example, most NOR flash devices can only be programmed one byte or word at a time.

Since NAND flash devices are subject to data failures (i.e., errors) that occur during device operation, system error-checking and correction algorithms are often implemented to ensure data read/write integrity. For example, error correction code (ECC) algorithms may be included within an externally-located flash memory controller to ensure that the data programmed to a memory cell is the same data read from the memory cell. To perform error correction, the data read from the memory cell is copied to an external memory controller having an ECC unit. The ECC unit determines whether the ECC code stored along with the data when it was programmed to a memory cell is identical to the ECC code calculated when the stored data is read. If a difference exists, the erroneous data is corrected or changed to its previously stored state.

Though system error-checking and correction algorithms improve reliability (by checking for and correcting errors in stored data), they tend to reduce the performance of NAND flash devices by transferring the data outside of the memory array to an external memory controller. This often increases the read and write times of the flash memory device. Therefore, a need remains for improved flash memory devices and methods for improving the read/write performance of a flash memory device while also maintaining high reliability.

SUMMARY OF THE INVENTION

The following description of various embodiments of systems, circuits and methods is not to be construed in any way as limiting the subject matter of the appended claims.

According to one embodiment, a method is provided herein for writing data to a memory device. For example, such a method may include copying one or more data sets from one location to another location within the memory device, where the step of copying is performed one or more times without error correction. In some cases, the step of copying one or more data sets may include temporarily storing a data set in a first location of the memory device before the data set is copied to a second location in the memory device. Such a writing step is commonly performed in NAND flash memory devices, although the method described herein may be applied to other types of flash memory.

In addition, the method may include counting a number of times the data sets are copied to the memory device without error correction. If the count is greater than a threshold value, the method may perform error correction before copying a next data set from one location to another within the memory device. For example, the method may copy the next data set to an external memory controller, where the next data set is checked for errors and corrected if an error is detected, before the next data set is copied to a location within the memory device. After the data has been checked for errors, the method may reset the count value to enable subsequent data sets to be copied to memory without error correction.

A memory device is provided herein, in accordance with another embodiment of the invention. For example, the memory device may include at least one memory array for temporarily storing a set of data in a first location of the memory array before the set of data is copied to a second location within the memory array. In addition, a counter may be included for counting a number of times the set of data is copied from the first location to the second location. Furthermore, control logic may be included for routing a next set of data through an external memory controller if the number of times exceeds a threshold value. In general, the external memory controller may include a memory interface for controlling access to the memory array and an error correction unit for correcting errors in data written to the memory array. Therefore, when the next set of data is transferred to the external memory controller, the error correction unit may check the next set of data for errors and correct the next set of data if an error is found, before the next set of data is copied to the second location of the memory device.

BRIEF DESCRIPTION OF THE DRAWINGS

Other objects and advantages of the invention will become apparent upon reading the following detailed description and upon reference to the accompanying drawings in which.

Figure 1:
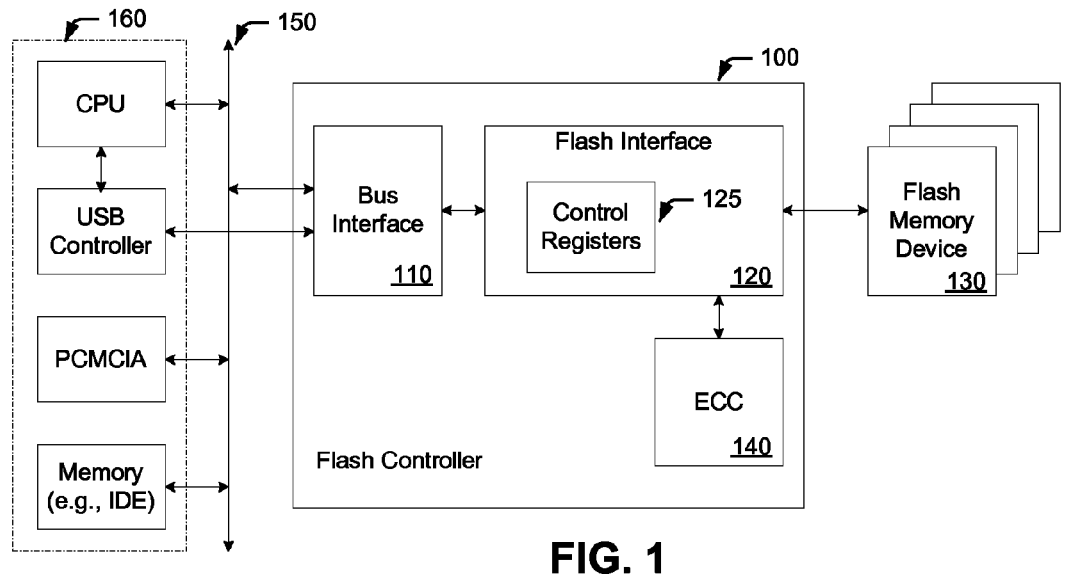
FIG. 1 is an exemplary block diagram of a NAND flash memory controller.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

A flash memory drive is used to provide non-volatile storage in many computer systems (such as a PC). The flash memory drive may be connected to the computer system via a Universal Serial Bus (USB) or other bus. NAND is a common type of flash memory. In most commonly available operating systems, there is no built-in NAND flash support. Rather than installing a special driver to support the peculiarities of NAND flash, conventional implementations employ a controller that uses the flash memory to emulate other commonly used mass storage devices like floppy drives and hard disk drives. The NAND flash memory controller may include an I/O-like interface for controlling access to the flash memory array. In this manner, the flash memory array may be controlled by sending data, commands and addresses through an 8-bit bus to various control registers within the flash interface.

FIG. 1 shows an exemplary block diagram of a NAND flash memory controller 100, in accordance with one embodiment of the invention. As shown in FIG. 1, memory controller 100 may include a bus interface 110 for controlling data exchange to/from host system bus 150, which may be coupled to a plurality of system components 160 such as a central processor (CPU), a universal serial bus (USB) controller, PCMCIA, SDIO, SRAM, IDE, among others. In some cases, bus interface 110 may actually include one or more different interfaces, such as a peripheral connect interface (PCI), a PCMCIA interface and one or more memory interfaces (e.g., a SRAM interface), among others.

As shown in FIG. 1, memory controller 100 includes a NAND flash interface 120 for interfacing with and managing one or more NAND flash memory devices 130. For example, NAND flash interface 120 may include a plurality of control registers 125 for temporarily storing data, commands and addresses sent to and/or retrieved from the flash interface. When a system component (such as a CPU) requests read or write access to a memory device 130, flash interface 120 generates the appropriate interface transactions. For example, a typical read operation may consist of the following: writing a "read" command to a command register, writing the address of a particular set of data to an address register, waiting for the memory device to put the requested data in a data register, and reading the requested data from the data register. A programming operation is similar to a read operation, except that data is first written to the data register and then programmed into the memory array at the address specified in the address register.

In NAND flash devices, read and programming (i.e., writing) operations take place on a page basis, rather than on a byte or word basis, as in most NOR flash devices. The size of a page is typically determined by the size of the data register included within the flash memory controller. The erase operation, on the other hand, takes place on a block basis, the size of which depends on the architecture of the memory device. Common block sizes include 16K bytes (for 512 byte pages) and 128K bytes (for 2K byte pages). Therefore, there are generally three basic operations in a NAND flash device: read a page, program a page and erase a block.

Figure 2:
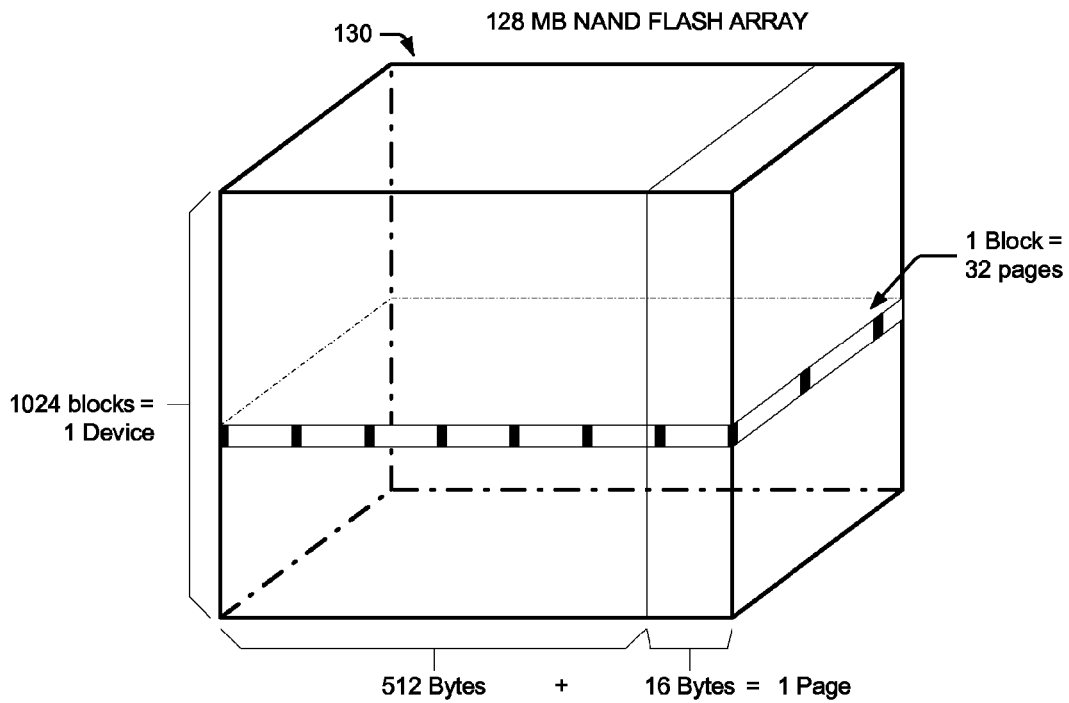
FIG. 2 is an exemplary embodiment of a NAND flash memory array.

To illustrate these concepts, FIG. 2 shows an exemplary embodiment of a 128 MB NAND flash array 130. In the embodiment shown, memory array 130 includes 1024 "blocks" of memory cells, although a greater or lesser number of blocks may be used to implement a larger or smaller memory array. For most NAND devices, the block size is 32 "pages," where each page is 528 bytes long. Therefore, if each memory cell stores one bit of data, each "page" may store up to about $2^{12}$ bits of data, whereas each "block" may store up to about $2^{17}$ bits of data. Since the original intent of the NAND flash device was to replace magnetic hard disk drives, a page size of 528 bytes is often used for storing 1 sector (i.e., 512 bytes) worth of data with 16 extra bytes for overhead, such as error correcting code (ECC).

In most NAND flash read operations, a page of data is typically transferred from memory to the data register for output. Likewise, a page of data may be written to the data register and then programmed into the memory array during a programming (i.e., write) operation. Since a "page" is substantially less than a "block," NAND read and programming operations may be referred to herein as "partial-block operations." In some cases, the term "partial-block operation" may be used to describe a read or programming operation that involves one or more pages, but less than a block, of data. In other words, a partial-block operation occurs when the data to be written to the memory array is not perfectly contained within a block. When a partial-block operation is performed, the surrounding information must be copied to the new block along with the new data. Since the NAND erase operation tends to erase an entire block of data (e.g., 32 consecutive pages) at a time, it may be referred to herein as a "block operation."

Since each block of memory is an independent unit, each block can be erased and reprogrammed without affecting the lifetime of the other blocks. For NAND memory, each "good" block of memory can usually be erased and reprogrammed more than 100,000 to 1,000,000 times before the end of life. If a block erase failure or page program failure occurs, the block is typically considered "bad" and is no longer accessed. However, random bit errors may occur during use of a NAND memory device, and does not necessarily mean that a block is bad. Therefore errors are usually classified into "soft errors" and "permanent failures," and are usually handled by a flash memory controller, such as the one illustrated in FIG. 1.

Unlike magnetic media, flash memory eventually wears out and no longer programs or erases in the allotted amount of time. A write/erase cycle endurance failure, which can manifest as a cell, page or block failure, is one example of a "permanent failure". If such a failure occurs, the entire block is usually marked as "bad" and no longer accessed.

On the other hand, "soft errors" such as over-programming (e.g., due to excess programming current) and programming operations that disturb nearby memory cells, may often be corrected by the flash memory controller. As shown in FIG. 1, for example, memory controller 100 may include error correction code (ECC) 140 for checking read/write data for random bit errors. The use of an error correcting code is generally considered necessary to maintain the integrity of the data stored within a NAND flash device. In most cases, single bit correcting (two bit detecting) Hamming code is used to implement the ECC algorithm, although other algorithms and/or bit lengths may be used as well. For example, two bit correcting (three bit detecting) Hamming code is sometimes used to implement the ECC algorithm. Though multi-bit ECC algorithms may improve reliability, they often do so at the expense of complexity in the logic design and increased logic resources. In addition, the use of additional ECC bits may cause a circuit designer to redesign the chip, a process that is often very costly and time consuming.

To perform error correction during a write operation, ECC 140 calculates an ECC code for the data stored in the data register and stores the ECC code along with the data (e.g., in the extra 16 bytes included within a page) when it is transferred to the addressed memory location. During a read operation, an ECC code is again calculated for the data requested from memory, and compared to the original code stored along with the data in the memory array. If a difference exists, the erroneous data is corrected or changed to its previously stored state.

Though ECC algorithms improve reliability (by checking for and correcting errors in read/write data), they often reduce the performance of NAND flash devices by requiring that the data be transferred outside of the memory device to an external memory controller (such as memory controller 100 of FIG. 1). This undesirably increases the read and write times of the flash memory device. The reduced performance is especially noticeable when writing to NAND flash devices, since writing almost always requires that data be copied from one memory location to another.

Figure 3:
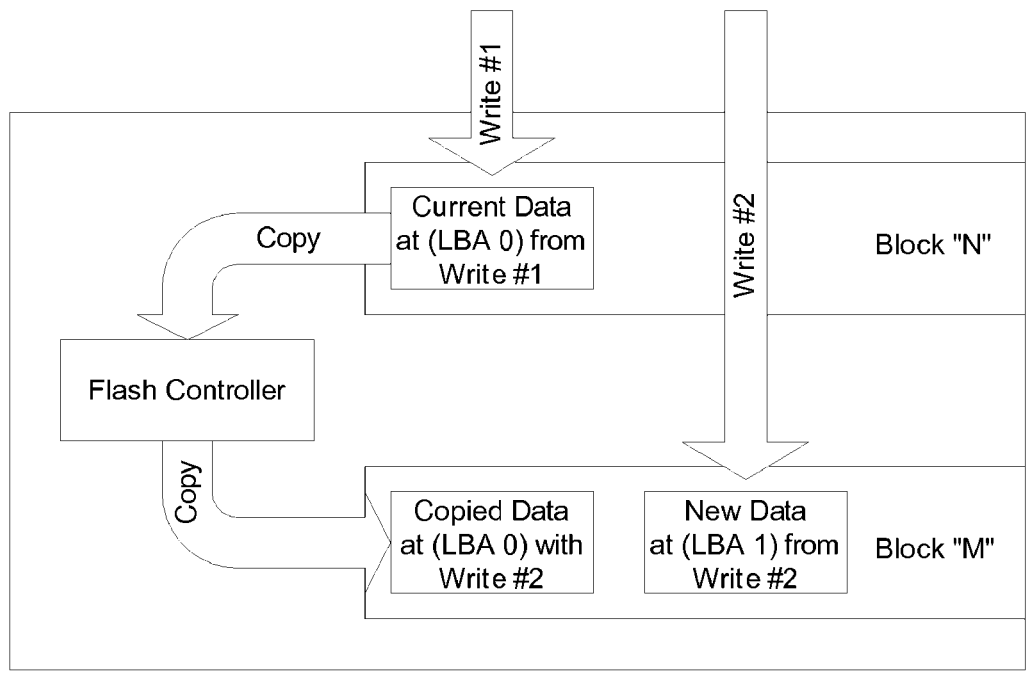
FIG. 3 is a block diagram illustrating one embodiment of an ECC operation.

As shown in FIG. 3, for example, data may be written to a first location in the memory array, such as logical block address 0 (LBA 0) of block "N," during a first write operation (write #1). In order to perform error correction, the data is copied to the flash memory controller, where it is checked for errors and corrected (if an error is found), before the data is copied to a second location within the memory array (e.g., LBA 0 of block "M") during a second write operation (write #2). In some cases, new data may also be written to a location within the memory array (e.g., LBA 1 of block "M") during the second write operation. This "new data" can be checked for errors by transferring the "new data" to the flash memory controller before the "new data" is stored in the memory array during a third write operation (not shown). In the embodiment of FIG. 3, write performance is reduced by the need to transfer the data outside of the memory array to the flash memory controller, where ECC operations are performed.

In an effort to improve write performance, some NAND flash memory arrays are provided with means for directly copying one flash area to another, and bypassing the NAND flash controller (and the ECC algorithm) altogether. For example, some NAND flash memory arrays may include a copy buffer for temporarily storing data, which is being copied from one location to another within the memory array. Other NAND flash memory arrays may use an operation, which enables data to be directly copied from one memory location to another without the use of a copy buffer. Such an operation is often referred to as a "copy-back program" or an "internal data move." Both methods improve write performance by eliminating the time it takes to transfer the data to an external memory controller, where the data is checked for errors and corrected (if necessary), before the data is copied to another (more permanent) location within the memory array.

Figure 4:
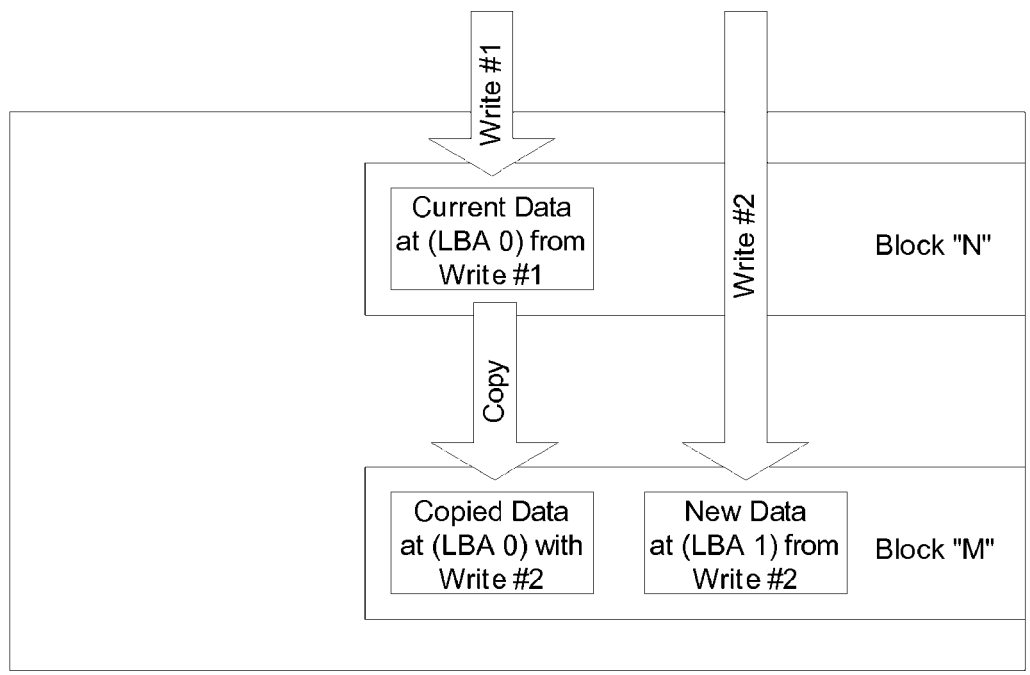
FIG. 4 is a block diagram illustrating one embodiment of a non-ECC operation.

FIG. 4 illustrates an exemplary manner in which data may be directly copied from one memory location to another without using an intermediate copy buffer. As shown in FIG. 4, the data is written to a first memory location (e.g., LBA 0 of block "N") during a first write operation (write #1) and copied directly to a second memory location (e.g., LBA 0 of block "M") during a second write operation (write #2). Write times are reduced by eliminating the need to transfer the data outside of the memory array.

If a copy buffer (not shown) is used, the data written to the first memory location may be temporarily stored within the copy buffer before it is copied to the second memory location during the next write operation. Since the copy buffer resides within the memory array, use of the copy buffer also improves write times by eliminating the need to transfer the data outside of the memory array.

Unlike the error correction scheme of FIG. 3, the direct copy methods of FIG. 4 do not protect against bit errors, and therefore, suffer from poor reliability. For example, the likelihood of a random bit error occurring increases each time data is written or copied to a different location within the memory array. Therefore, even though the direct copy methods of FIG. 4 may improve write performance (to some extent), they do so by reducing the reliability of the write data.

Figure 5:
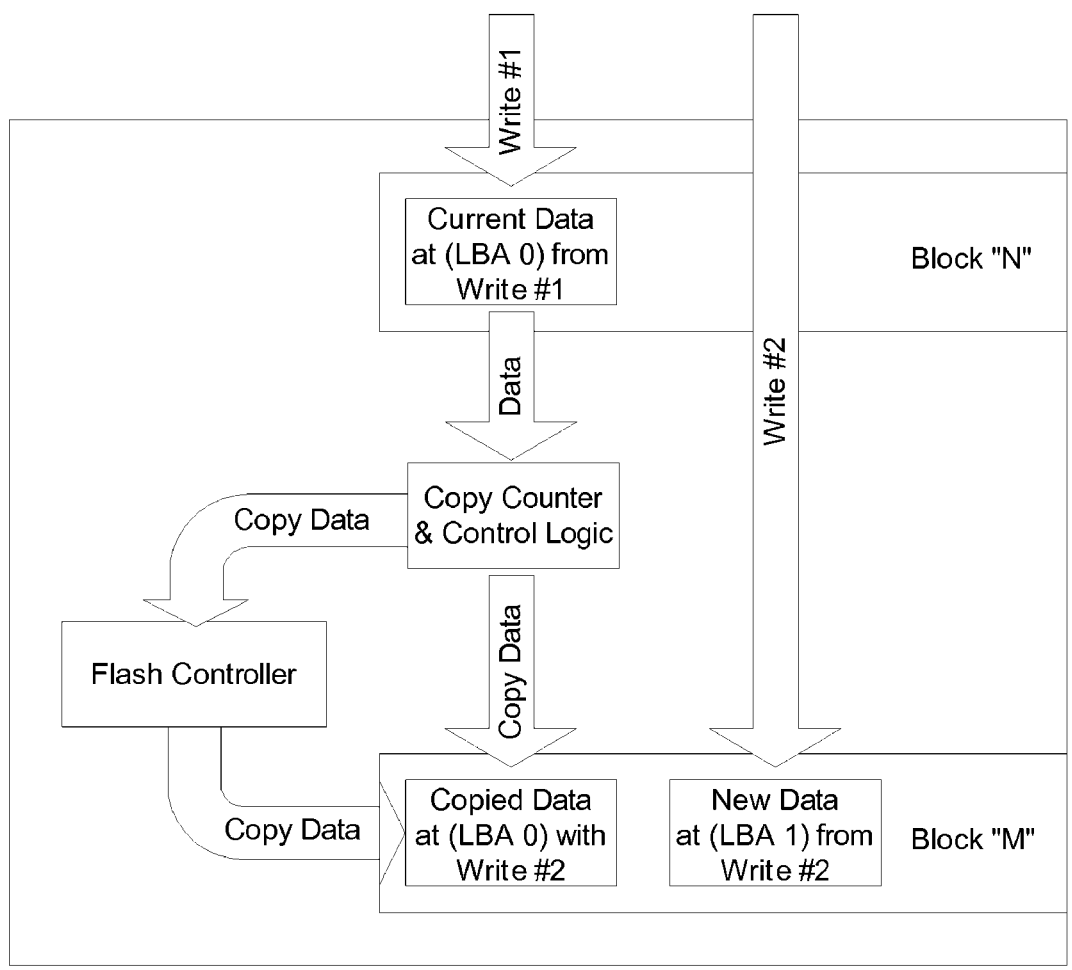
FIG. 5 is a block diagram illustrating an exemplary manner in which ECC and non-ECC operations may be performed, in accordance with one embodiment of the invention.
Figure 6:
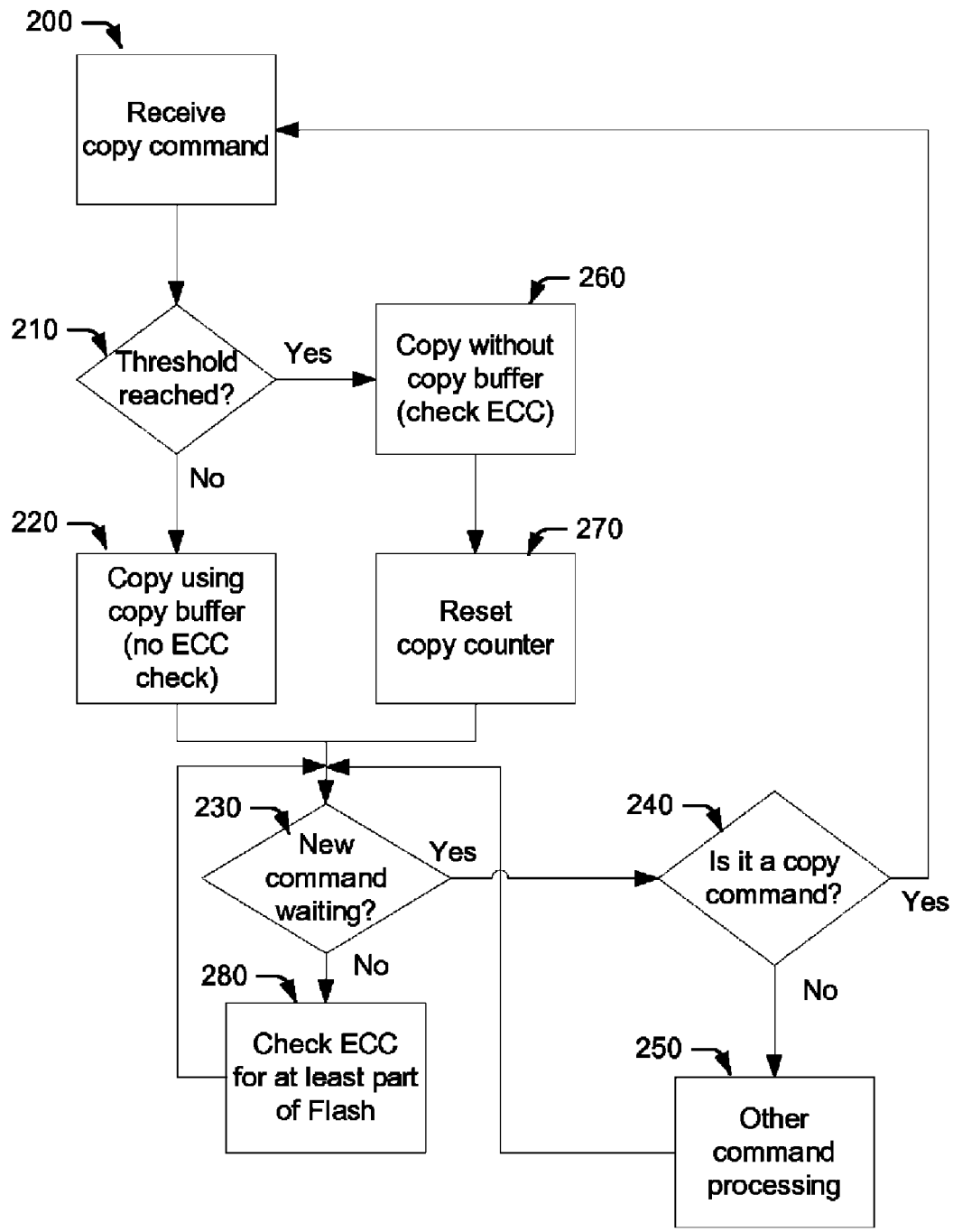
FIG. 6 is a flow chart diagram of an exemplary method for performing ECC and non-ECC operations, in accordance with one embodiment of the invention.

FIGS. 5 and 6 illustrate exemplary embodiments of preferred systems and methods that may be used for improving the write performance of a flash memory device, while at the same time, maintaining high reliability. In most cases, the concepts described herein may be used to improve the performance and reliability of a NAND flash memory device, although the concepts may also be applied to other types of flash memory devices (e.g., NOR flash, compact flash) or any other memory device that uses partial-block operations. In addition, the concepts described herein are typically used to improve the performance and reliability of partial-block operations, such as page read and programming operations. As noted above, a "partial-block operation" may be a read or programming operation that involves one or more pages, but less than a block, of data. As described in more detail, the performance and reliability of partial-block operations is improved by employing an error correction scheme that only checks for errors periodically and/or in response to reaching a threshold level, instead of checking for errors during each read/write/copy operation.

In NAND flash devices, data is typically copied from one memory location to another during programming (i.e., write) operations. FIG. 5 illustrates an exemplary manner in which data may be copied from one memory location to another, in accordance with a preferred embodiment of the invention. Similar to the embodiments shown in FIGS. 3 and 4, the data may be written to a first memory location (e.g., LBA 0 of block "N") during a first write operation (write #1). However, unlike FIGS. 3 and 4, the data is sent to a copy counter and control logic block, where a count value is incremented to indicate the occurrence of a non-ECC copy operation. If the count value stored within the copy counter is less than a predetermined threshold value, the data may be copied to a second memory location (e.g., LBA 0 of block "M") during a second write operation (write #2). In this manner, the data may be directly copied from one memory location to another without error correction. Such an operation may be referred to as a "non-ECC operation."

In some cases, the copy counter and control logic block may be stored in the memory controller. In most cases, however, the copy counter and control logic block are stored within the memory array itself. For example, the copy counter and control logic block may be stored within a redundant area of the memory array (such as, e.g., a logical to physical table). Regardless of where the copy counter and control logic block are stored, use of these components improves write performance (similar to the embodiment of FIG. 3) by not requiring the data to be transferred out of the memory array. In some cases, a single copy counter may be used for counting all non-ECC operations. In other cases, a different copy counter may be included for counting the non-ECC operations associated with each block of the memory array.

In most cases, a number of non-ECC operations may be performed and the count value may be incremented until the predetermined threshold value is reached. However, once the count value reaches the predetermined threshold value, an ECC-operation may be performed to ensure that the data is reliable. For example, instead of copying the data directly to the second memory location, the copy counter and control logic block may transfer the data to an external memory controller (such as flash memory controller 100 of FIG. 1), where the data can be checked for errors and corrected if an error is found. Once checked, the data may be copied to the second memory location and the corresponding copy counter may be reset to once again enable non-ECC operations to be performed.

The embodiment of FIG. 5 improves write performance by performing a number of non-ECC operations until a threshold value is reached, and thereafter performing an ECC operation to ensure data reliability. In general, the threshold value may be selected to balance reliability and performance; higher threshold values may be used in high-performance applications, whereas lower threshold values may be desired when reliability is of utmost concern. In most cases, the threshold value is based on the error probability of a particular NAND flash device, which may differ between manufacturers of the device. For example, a threshold value may be selected by a manufacturer or user of the device to indicate an upper threshold of a "danger zone," beyond which random bit errors are more and more likely to occur. The threshold value may be as low as one non-ECC operation, as high as thousands of non-ECC operations, or substantially any value desired by the manufacturer or use.

FIG. 6 illustrates a preferred method for improving the write performance of a flash memory device, while maintaining high reliability. In some cases, the method may begin by receiving a write or copy command (in step 200). At step 210, the method checks to see if a "copy threshold" has been reached. If the copy threshold has not been reached, the data is copied from one memory location to another without error correction (in step 220). As shown in FIG. 5 and described above, the data may be copied with or without the use of an intermediate copy buffer. The copy counter is incremented once the data is copied and a new command may be received (in step 230). If the new command happens to be a write (or copy) command (in step 240), the method may revert back to step 200. Otherwise, other command processing may be performed (in step 250).

Once a new write or copy command is received (in step 200), the method may once again check to see if the copy threshold has been reached (in step 210). If the copy threshold has been reached, the data is copied from one memory location to another with error correction (in step 260). In other words, the data may be copied to an external memory controller (such as flash memory controller 100 of FIG. 1), where the data is checked for errors and corrected (if necessary), before the data is copied to another (more permanent) memory location. This is referred to as an ECC-operation and is performed to ensure that the data is reliable. Once the data has been checked, the copy counter is reset (in step 270) to enable non-ECC operations to occur until the copy threshold is again reached. For example, method steps 200, 210, 220, 230, 240, 250, 260, and 270 may be repeated for each new command received.

Figure 7:
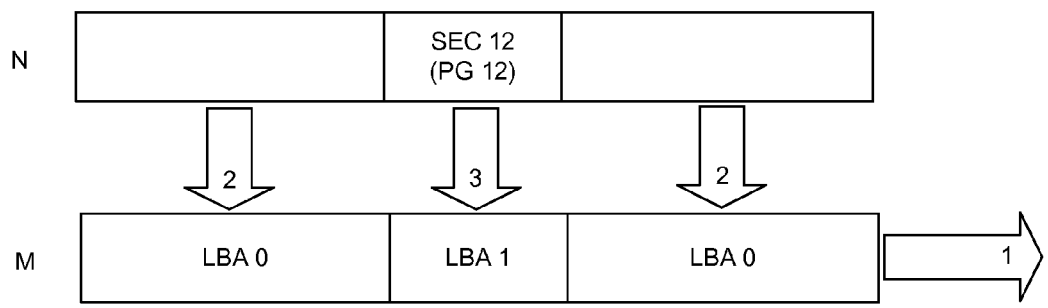
FIG. 7 is a block diagram further illustrating the copy operation of FIGS. 5 and 6, invoked from a copy command of LBA0 data (i.e., a sector or page) from a first physical block N to a second physical block M prior to writing LBA1 data to the second physical block M within, preferably, the same physical block.

Turning to FIG. 7, a further illustration of a copy routine is shown. FIG. 7 depicts what would occur if a write to one or more pages within a block is to take place. The write operation might be to a sector or at least one page of a block at logical block address 1 (LBA 1). A write to a sector is a write to a portion of a physical block, and not the entire block. Thus, the term "LBA" is really referencing a sub-portion of a block addressable as one or more pages of a particular physical block location, yet not the entire block. In the example of FIG. 7, a copy to a sector 12 (or page 12) may be addressable within a portion of the physical location of block M. A write to LBA 1 of a particular page (i.e., 12) of LBA 1, must first undergo an erase operation. Thus, before even a portion of a physical block can be written to, that block must first be erased. Physical block M must therefore have each and every one of its storage cells erased before it can be programmed or written to. As shown by the arrow labeled 1, the erase routine must erase all data within physical block M. Thereafter, as shown by arrows labeled 2, data that was previously stored at physical block N can be copied from their respective portions to block M at LBA 0.

The copy routine from block N to block M may occur through a buffer placed internal to and upon the same monolithic substrate as the array of flash storage cells. In this fashion, copy operation 2 forces a move from one block to another via a buffer, and the move is performed entirely upon and exclusively within a single monolithic substrate. This sufficiently enhances the speed of the copy operation since data does not leave the output pin, data is not placed on an external bus, data does not pass through another integrated circuit outside the flash memory, and data does not need to return back upon that bus in a turnaround operation.

FIG. 7 illustrates a third operation shown by the arrow labeled as reference numeral 3. The third operation is a write of page/sector 12 targeted for physical block N, yet is written to physical block M at LBA 1. LBA 1 is at a different page or sector address than LBA 0. However, before LBA 1 and LBA 0 data is placed in block M, the entire block M must be erased. The copy operation is necessary to preserve pages, even though such pages (i.e., pages at LBA 0) are not being written to.

Figure 8:
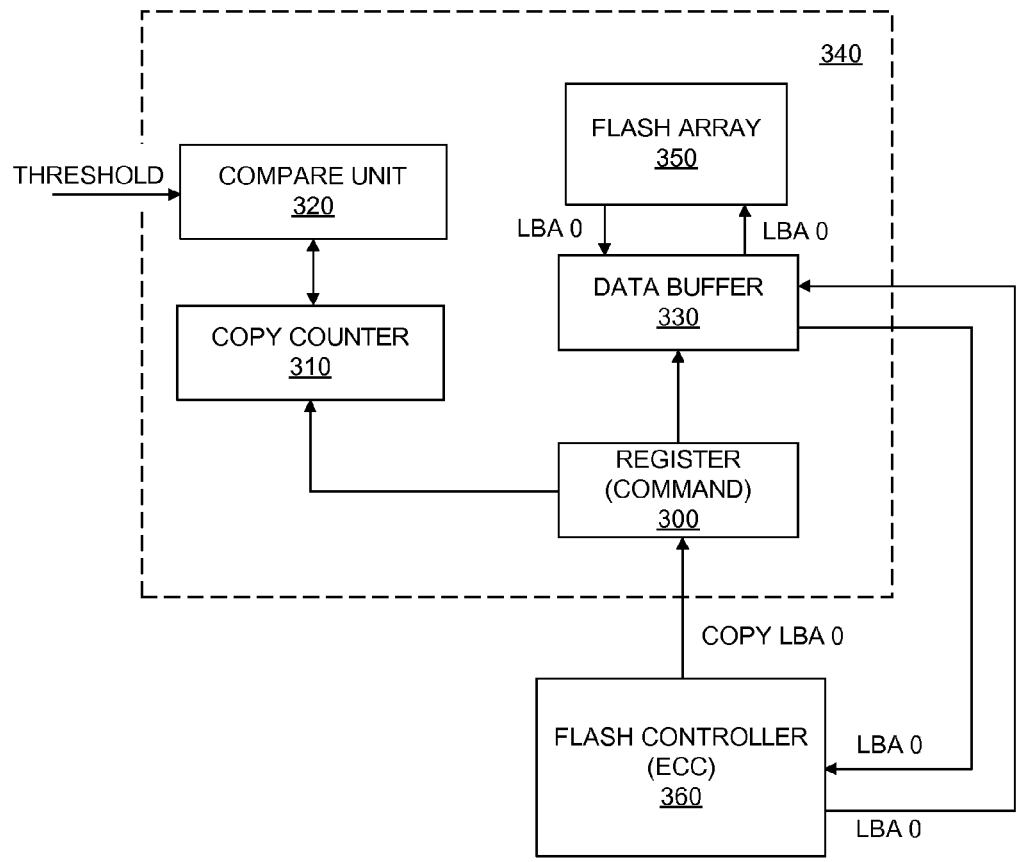
FIG. 8 is a block diagram of the copy counter and control logic of FIG. 5 embodied upon the monolithic substrate also containing the flash memory storage cell array for performing copy operations exclusively within the integrated circuit until a threshold number of copy operations to a page or sector within a block have occurred, in which case a copy occurs external to the integrated circuit, as described in FIGS. 5 and 6.

FIG. 8 illustrates in further detail the copy counter and control logic block of FIG. 5. Copy counter and control logic shown in FIG. 8 and referenced as numeral 340 comprises various blocks used to receive not only data, but also command and address signals. For example, copy counter and control logic 340 can comprise a command register 300, copy counter 310, compare unit 320, and data buffer 330. Blocks 300-330 are preferably embodied on the same monolithic substrate that contains the flash array 350 comprising, for example, blocks N and M of FIG. 5. The flash array can be alternatively designated simply as a non-volatile memory array and, according to one embodiment, can be a NAND flash array. The monolithic substrate 340 comprises an integrated circuit made up of the items shown within the dashed lines, as well as possibly other circuit items. The flash controller 360, however, is external to the integrated circuit of copy counter and control logic 340 and preferably configured upon a separate integrated circuit. A memory bus, across which control, address, and data are sent, couples the integrated circuit 340 to flash controller 360.

Shown, according to one example, is a command sent from flash controller 360 to a command register among many registers, such as data registers and address registers, generally categorized as item 300. The command can be a copy command, instructing flash array 350 to move or copy a data set within LBA 0 from one physical block to another physical block. When the copy command is received, copy register 300 will activate a counter 310. Counter 310 will then read a known location in buffer 330 that contains the copy counter value. Counter 310 will then increment the copy counter value retrieved from buffer 330. If the copy counter value is higher than a threshold sent to compare unit 320, a signal is sent to the host device which is preferably the CPU (included within block 160 of FIG. 1). That signal will indicate that the data sent from flash array 350 to data buffer 330 must thereafter be sent external from integrated circuit 340 to flash controller 360. Buffer 330 essentially temporarily retains the data set at LBA 0 from flash array 350, and counter 310 instructs buffer 330 to send the data set at LBA 0 to controller 360 depending on the result of the compare unit 320. If the compare unit denotes that the present count is greater than the predefined threshold, then buffer 330 will send the data at LBA 0 external to the memory device of integrated circuit 340.

The data set at LBA 0 sent to controller 360 undergoes a combination with other bytes of information, those other bytes being error correction bits. As described previously in FIG. 2, the error correction bits can be possibly 16 bytes in length. Contained within the ECC 140 (FIG. 1) is combinatorial logic which logically combines, for example, 512 bytes with 16 bytes to produce a pre-defined (or desired) set of logical values. For example, the desired logical values might be all 0s and, thus, when the 512 bytes are logically combined with 16 bytes within the combinatorial logic, all 0 bit values are expected. If a logic 1 should appear, depending on the configuration of the combinatorial logic, the erroneous bit position and the correct bit value can be ascertained anywhere within the 512 bytes of data which form a page. Thus, if the data set at LBA 0 is one page length long, the ECC bytes conveyed with the data bytes determine if there are any erroneous bits contained therein. Those bits are then corrected and thereafter sent back to data buffer 330 for placement into the "copied to" physical block of flash array 350.

Figure 9:
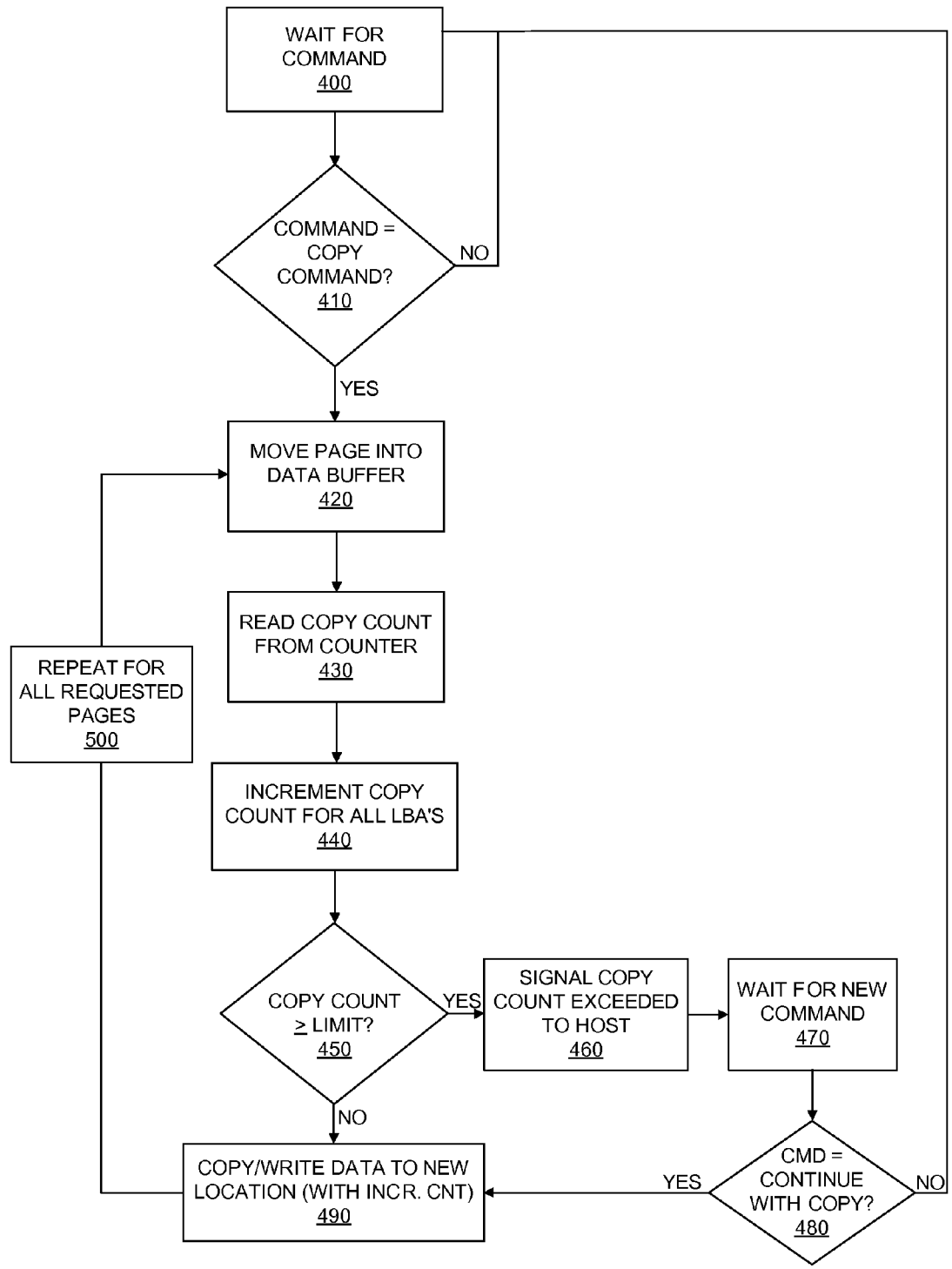
FIG. 9 is a flow diagram of an exemplary copy counter and control logic function of FIG. 5 for performing internal copy operations if a threshold has not been reached, and performing external copy operations if a threshold has been reached.

FIG. 9 illustrates a flow diagram indicating the operation of the copy counter and control logic blocks shown in FIG. 8. The command register 300 (FIG. 8) can wait for the next command 400. When the command is a copy command 410, a page or possibly more than one page yet less than an entire block is moved 420 from the flash array to the data buffer. If the command is not a copy command, then block 400 simply waits for the next copy command. As the data is read from the flash array into the data buffer, the count value stored within the copy counter is read 430. Moreover, the copy count for all LBAs are incremented at step 440.

The copy from flash array 350 into buffer 330 and back to another physical address within flash array 350 is shown in FIG. 8. This copy routine occurs entirely internal to integrated circuit 340 provided, of course, the copy counter value does not exceed a threshold value. If, for example, the copy count value does exceed the threshold value or limit at decision block 450, then a signal is sent to the host or CPU to note that the copy count has been exceeded 460. Thereafter, the copy counter and control logic waits for the new command 470. If that command instructs a continuance with the copy command 480, then the copy proceeds to the new location 490 with an increment to the copy counter. When the host is signaled that a copy count has been exceeded 460, then the copy will occur external the memory device and, via the ECC combinatorial logic, the copy is continued back to the memory device 490. If, however, the copy count is not exceeded at decision block 450, then the copy 490 can occur internal to the memory device and does not leave the memory device integrated circuit, through the memory controller and back to the memory device via the memory bus. The copy/write routine 490 is repeated 500 for all requested pages so that a copy count can be maintained for each page being copies at that particular location or LBA. That copy count is maintained until the LBA is copied again, whereby the copy count is thereafter read 430 and the copy count is incremented 440. The incremented copy count is then checked against a threshold value by the compare unit 320 (FIG. 8) to denote whether an ECC operation is needed.

The flash memory controller may become idle when no new commands are waiting to be processed (in step 230). In some cases, the flash memory controller may perform an ECC check on at least a portion of the flash memory (in step 280) to ensure that the data stored therein is correct. For example, during times when the flash memory is not being used, the flash memory controller may scan those blocks, which were copied using the copy buffer, for errors. If any errors are found, the errors are corrected and the counter is cleared (if necessary). The counter may also be cleared if no errors are found. Therefore, in addition to error checking data when a threshold value is reached, the method described herein may periodically perform ECC checks during idle states to ensure data reliability.

The systems and methods described herein provide a method for safely using a NAND copy buffer or copy-back program. For example, the systems and methods described herein perform a number of non-ECC operations, each of which is counted until a copy threshold is reached. Once the copy threshold is reached, an ECC operation is performed to ensure data reliability. A copy counter may be initialized with the copy threshold value, which may be selected by a user or manufacturer of the memory device. As such, the systems and methods described herein may decide when to force an ECC operation using the copy threshold value. In some cases, the systems and methods described herein may additionally or alternatively perform one or more ECC checks in the background (e.g., when the flash memory controller is idle). In this manner, the present invention is able to improve write performance of a flash memory device without sacrificing reliability.

Therefore, one advantage is that the systems and methods described herein provide performance enhancements as well as reliability, gaining one of the main advantages of a multi-bit ECC unit without having to add one to the controller.

In an alternate embodiment, a multiple-bit ECC unit could be used, so that higher error probability is less harmful. However, if the copy buffer is used for too many non-ECC copy operations (i.e., if the threshold value is set too high), the use of a multi-bit ECC may not provide sufficient protection against errors.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved solution and the methods of designing and manufacturing the same that are widely known and are not relevant to the present invention have been omitted from the preceding description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It will be appreciated by those skilled in the art having the benefit of this disclosure that this invention is believed to provide an improved flash memory device and methods for improving the write performance and reliability thereof. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A memory device comprising:
   data storage locations;
   a controller configured to copy a data set from a selected data storage location within the memory device;
   a counter configured to count a number of times the data set is copied from the selected data storage location;
   the controller also configured to copy the data set to an individual data storage location within the memory device:
   (a) without error checking when the count does not exceed a threshold value, and
   (b) when the count exceeds the threshold value, after error checking and correction has been performed on the copy of the data set.

2. The memory device as recited in claim 1, further comprising an external memory controller configured to perform said error checking and correction and to copy the corrected data to the individual data storage location within the memory device.

3. The memory device as recited in claim 2, wherein a first monolithic substrate embodies the memory device, and a second monolithic substrate embodies the external memory controller.

4. The memory device as recited in claim 1, wherein said counter is incremented each time the data set of a particular page within a particular block is being written to.

5. The memory device as recited in claim 1, wherein the counter is incremented each time the data set is copied for a particular page within a particular block.

6. The memory device as recited in claim 1, wherein the counter is reset each time the count is equal to the threshold value.

7. The memory device as recited in claim 1, wherein the threshold value is set at approximately the number of times a storage location within the memory device can reliably store said data set.

8. The memory device as recited in claim 1, wherein the controller is configured to initiate the error checking and correction during times when a copy operation is not pending and before the count is greater than the threshold value.

9. A method for copying data in a memory device, the method comprising:
   in response to a copy command to copy data from a data location in the memory device, copying the data to a data buffer within the memory device, checking a copy count value, and incrementing the copy count value to indicate that the data has been copied from the data location to the data buffer;
   when the copy count value does not exceed a threshold value, copying the data from the data buffer to an individual data location within the memory device without error checking; and
   when the copy count value exceeds the threshold value, before copying the data to the individual data location within the memory device, checking the data for errors and correcting when an error is found.

10. The method as recited in claim 9, wherein the data is checked for errors by writing the data from the data buffer to a memory controller embodied upon a second monolithic substrate external to and separate from a first monolithic substrate upon which the memory device is embodied.

11. The method as recited in claim 9, wherein when the copy count value exceeds the threshold value, the method further comprises resetting the copy count value once the data has been checked for errors.

12. The method as recited in claim 9, further comprising periodically performing the error checking and correction during times when a copy operation is not pending.

13. A memory system, comprising:
a memory device coupled to a memory controller external to the memory device;
the memory device includes:
an array of non-volatile storage cells;
a data buffer configured to receive a set of data copied from a first location within the array of storage cells;
a counter configured to provide a copy count of a number of times the set of data is copied from the first location; and
a control unit configured to (a) forward the set of data from the data buffer to an individual location in the array of storage cells without error checking when the copy count does not exceed a threshold value equal to at least one, and (b) route the set of data from the data buffer to the memory controller when the copy count exceeds the threshold value;
the memory controller includes:
an error checking and correction unit configured to check for and to correct errors in the set of data routed to the memory controller and to copy the corrected set of data to the memory device data buffer for copying to the individual location in the array of storage cells.

14. The memory system as recited in claim 13, wherein the error checking and correction unit comprises combinatorial logic that combines the set of data with error correction data to produce a result that indicates whether the set of data contains an error.

15. The memory system as recited in claim 13, wherein the checking and error correction unit comprises combinatorial logic that combines the set of data with error correction data to produce a result that indicates which bit of the error correction data is erroneous, and a proper bit value for the erroneous bit.

16. The memory system as recited in claim 13, wherein the checking and error correction unit comprises combinatorial logic configured to combine the set of data with error correction data to produce a result that indicates which bit of the set of data is erroneous, and configured to correct the erroneous bit before the set of data is copied to the individual location in the array of storage cells.

17. The memory system as recited in claim 16, wherein the counter is cleared after the set of data is checked for errors.

18. The memory system as recited in claim 13, wherein at least a portion of the memory device is periodically checked for errors when read, write or copy commands are not being sent to the storage cells or the memory controller.

\* \* \* \* \*